(12) United States Patent
Abiri Jahromi et al.

(10) Patent No.: US 11,705,723 B2
(45) Date of Patent: Jul. 18, 2023

(54) SYSTEM AND METHOD FOR PROTECTION OF AN ELECTRICAL GRID

(71) Applicant: THE GOVERNING COUNCIL OF THE UNIVERSITY OF TORONTO, Toronto (CA)

(72) Inventors: Amir Abiri Jahromi, Leeds (GB); Aboutaleb Haddadi, Montreal (CA); Deepa Kundur, Oakville (CA)

(73) Assignee: THE GOVERNING COUNCIL OF THE UNIVERSITY OF TORONTO, Toronto (CA)

(*) Notice: Subject to any disclaimer, the term of this patent is extended or adjusted under 35 U.S.C. 154(b) by 0 days.

(21) Appl. No.: 17/997,867

(22) PCT Filed: May 19, 2021

(86) PCT No.: PCT/CA2021/050677
§ 371 (c)(1),
(2) Date: Nov. 3, 2022

(87) PCT Pub. No.: WO2021/232152
PCT Pub. Date: Nov. 25, 2021

(65) Prior Publication Data
US 2023/0129205 A1    Apr. 27, 2023

Related U.S. Application Data

(60) Provisional application No. 63/029,100, filed on May 22, 2020.

(51) Int. Cl.
*H02H 7/26*    (2006.01)
*H02H 1/00*    (2006.01)
(Continued)

(52) U.S. Cl.
CPC ............ *H02H 7/26* (2013.01); *H02H 1/0007* (2013.01); *H02J 3/0012* (2020.01); *H02J 13/00002* (2020.01); *H03K 19/21* (2013.01)

(58) Field of Classification Search
CPC .......... H02H 1/0007; H02H 3/28; H02H 3/30; H02H 3/38; H02H 7/26; H02H 7/261;
(Continued)

(56) References Cited

U.S. PATENT DOCUMENTS 4,484,245 A * 11/1984 McFall ................. H02H 7/262
361/64
2003/0007514 A1 * 1/2003 Lee ....................... H02H 1/0061
370/477
2012/0095707 A1    4/2012 Li et al.

FOREIGN PATENT DOCUMENTS

JP    2009017780 A  *  1/2009
JP    2009017780 A     1/2009
(Continued)

OTHER PUBLICATIONS

International Search Report for PCT application No. PCT/CA2021/050677, CIPO, search completed: Jul. 30, 2021, dated Aug. 6, 2021.
(Continued)

*Primary Examiner* — Jared Fureman
*Assistant Examiner* — Nicolas Bellido
(74) *Attorney, Agent, or Firm* — Bhole IP Law; Anil Bhole; Marc Lampert

(57) ABSTRACT

A system and method for protection of an electrical grid. A respective one of the substations of the system including: a first directional protective relay to generate a signal operating on the electrical power line between the respective one of the substations and a remote one of the substations; a cyber health module to receive remote signals from two remote directional protective relays and output a reliability signal based on consistency of the remote signals and a
(Continued)

status of the communication channels being operational; a circuit breaker to interrupt electrical power flow when directed; and a comparison circuit to receive signals and to direct the circuit breaker to interrupt electrical power flow when the reliability signal from the cyber health module indicates consistency, the first directional protective relay indicates fault, and at least one of the remote directional protective relays indicate fault.

20 Claims, 9 Drawing Sheets

(51) Int. Cl.
    *H02J 3/00*     (2006.01)
    *H02J 13/00*     (2006.01)
    *H03K 19/21*     (2006.01)

(58) Field of Classification Search
    CPC .... H02J 13/00; H02J 3/0012; H02J 13/00002; H03K 19/21
    See application file for complete search history.

(56) References Cited

FOREIGN PATENT DOCUMENTS

| | | | |
|---|---|---|---|
| KR | 102103936 B1 * | 3/2020 | |
| KR | 102103936 B1 | 4/2020 | |
| WO | 2008004727 A1 | 1/2008 | |

OTHER PUBLICATIONS

Written Opinion of the International Searching Authority for PCT application No. PCT/CA2021/050677, CIPO, opinion completed: Aug. 2, 2021, dated Aug. 6, 2021.
"Comparing the Impacts of the 2005 and 2008 Hurricanes on U.S. Energy Infrastructure", US Department of energy, Feb. 2009, Retrieved from: https://www.energy.gov/ceser/articles/comparing-impacts-2005-and-2008-hurricanes-US-energy-infrastructure-Feb. 2009.
"Enhancing the Resilience of the Nation's Electricity System", National Academies of Sciences, Engineering, and Medicine, 2017, Washington, DC: The National Academies Press https://doi.org/10.17226/24836.
"Iec-Tr 61850-90-4 communication networks and systems for Power Utility Automation—Part 90-4: Network engineering guidelines", International Electrotechnical Commission / IEC, (2013), ICS 33.200, ISBN: 978-2-8322-0903-5.
"IEEE Guide for Protective Relay Applications to Transmission Lines", IEEE Std C37.113-2015 (Revision of IEEE Std C37.113-1999), vol. no., pp. 1-141, Jun. 30, 2016, doi: 10 1109/IEEESTD.2016.7502047.
"ISA99, Industrial Automation and Control Systems Security", International Society of Automation, isa.org. (n.d.). Retrieved Jan. 27, 2023, from https://www.isa.org/standards-and-publications/isa-standards/isa-standards-committees/isa99.
"Protection Using Telecommunications", Joint Working Group 34/35.11, Aug. 2001, Extract from CIGRE Publication Protection Using Telecommunications.
Andersson, Göran, et al., "Blackout Experiences and Lessons, Best Practices for System Dynamic Performance, and the Role of New Technologies", (2007), IEEE Task Force Report, IEEE task force on blackout experience, mitigation, and role of new technologies.
Behrendt, Kenneth C., "Relay-to-Relay Digital Logic Communication for Line Protection, Monitoring, and Control", Schweitzer Engineering Laboratories, Inc. (1998), Revised edition released Nov. 1998, Originally presented at the 32nd Annual Minnesota Power Systems Conference, Oct. 1996.
Blackburn, J. Lewis, et al., "Protective Relaying: Principles and Applications", (2007), CRC Press, Taylor & Francis Group, ISBN: 978-1-57444-716-3.
Brand, Klaus-Peter, et al., "Substation Automation Handbook", (2003), Utility Automation Consulting Lohmann, ISm3-85758-951-5.
Campbell, Richard J., "Electric Grid Cybersecurity", Report# R45312, Sep. 4, 2018, Congressional Research Service, https://crsreports.congress.gov/product/pdf/R/R45312/1.
Che, Liang, et al., "Adaptive Protection System for Microgrids: Protection practices of a functional microgrid system", IEEE Electrification Magazine, vol. 2, No. 1, pp. 66-80, Mar. 2014, doi: 10.1109/MELE.2013.2297031.
Cintuglu, Mehmet H., et al., "Protection of Autonomous Microgrids Using Agent-Based Distributed Communication", IEEE Transactions on Power Delivery, vol. 32, No. 1, pp. 351-360, Feb. 2017, doi: 10.1109/TPWRD.2016.2551368.
Dolezilek, David, et al., "Complete IEC 61850 Protection and Control System Cybersecurity Is So Much More Than Device Features Based on IEC 62351 and IEC 62443", Schweitzer Engineering Laboratories, Inc., (2019), Revised edition released Jul. 2019, Originally presented at the 10th Annual Protection, Automation and Control Worid Conference, Jun. 2019.
Ellen, Ellen, et al., "Going Beyond Cybersecurity Compliance: What Power and Utility Companies Really Need To Consider", IEEE Power and Energy Magazine, vol. 14, No. 5, pp. 48-56, Sep.-Oct. 2016, doi: 10.1109/MPE.2016.2573898.
Hooshyar, Ali, et al., "Microgrid Protection", Proceedings of the IEEE, vol. 105, No. 7, pp. 1332-1353, Jul. 2017, doi: 10.1109/JPROC.2017.2669342.
Ishchenko, Dmitry, et al., "Secure Communication of Intelligent Electronic Devices in Digital Substations", 2018 IEEE/PES Transmission and Distribution Conference and Exposition (T&D), Denver, CO, USA, 2018, pp. 1-5, doi: 10.1109/TDC.2018.8440438.
Jahromi, Amir Abiri, "Cyber-Physical Attacks Targeting Communication-Assisted Protection Schemes", IEEE Transactions on Power Systems, vol. 35, No. 1, pp. 440-450, Jan. 2020, doi: 10.1109/TPWRS.2019.2924441.
Kezunovic, Mladen, et al., "Design, Modeling and Evaluation of Protective Relays for Power Systems", (2016), Springer International Publishing, https://doi.org/10.1007/978-3-319-20919-7.
M. Amin, M. Amin, et al., "A Communication-Assisted Protection Strategy for Inverter-Based Medium-Voltage Microgrids", IEEE Transactions on Smart Grid, vol. 3, No. 4, pp. 2088-2099, Dec. 2012, doi: 10.1109/TSG.2012.2211045.
Roberts, Jeff, et al., "Sympathetic Tripping Problem Analysis and Solutions", Schweitzer Engineering Laboratories, Inc., (2002), Revised edition released May 2002, Originally presented at the 24th Annual Western Protective Relay Conference, Oct. 1997.
Schweitzer, Edmund O., et al., "Digital Communications for Power System Protection: Security, Availability, and Speed", Schweitzer Engineering Laboratories, Inc., (2010), SEL Journal of Reliable Power, vol. 1, No. 1, Jul. 2010, Originally presented at the 25th Annual Western Protective Relay Conference, Oct. 1998, doi: 10.1049/cp.20010108.
Sidhu, Tarlochan S., et al., "Modelling and Simulation for Performance Evaluation of IEC61850-Based Substation Communication Systems", IEEE Transactions on Power Delivery, vol. 22, No. 3, pp. 1482-1489, Jul. 2007, doi: 10.1109/TPWRD.2006.886788.
Smith, Jess, et al., "Defense-in-Depth Security for Industrial Control Systems", Schweitzer Engineering Laboratories, Inc., Rev. ed. released Aug. 2022, Published in Sensible Cybersecurity for Power Systems: A Collection of Technical Papers Representing Modem Solutions, 2018, Originally presented at the EEA Conference, Jun. 2016.
Sortomme, Eric, et al., "Microgrid protection using communication-assisted digital relays", IEEE PES General Meeting, Minneapolis, MN, USA, 2010, pp. 1-1, doi: 10.1109/PES.2010.5588146.
Stouffer, Keith, et al., "Guide to industrial control systems (ICS) security: NIST Special Publication 800-82 Revision 2", (2015), NIST, US department of commerce, https://doi.org/10.6028/nist.sp.800-82r2.

(56) References Cited

OTHER PUBLICATIONS

Vugrin, Eric, et al., "Resilience Metrics for the Electric Power System: A Performance-Based Approach", (2017). Resilience metrics for the electric power system: A performance-based approach, https://doi.org/10.2172/1367499.
Ward, Solveig, et al., "Cyber Security Issues for Protective Relays; C1 Working Group Members of Power System Relaying Committee", 2007 IEEE Power Engineering Society General Meeting, Tampa, FL, USA, 2007, pp. 1-8, doi: 10.1109/PES.2007.385583.

* cited by examiner

SYSTEM AND METHOD FOR PROTECTION OF AN ELECTRICAL GRID

TECHNICAL FIELD

The following relates generally to protection of electric power transmission and distribution grids; and more specifically, to a system and method for protection of an electrical grid.

BACKGROUND

Improving the resilience of power systems to large area, long duration outages is a substantial challenge in the power industry. This can be due to the size, geographic footprint, and complexity of power systems, in addition to the diversity of power system failures that can occur. Moreover, the difficulty in defining proper metrics for quantifying and measuring the resilience of power systems provides another restraining factor.

There are many factors that can contribute to the occurrence of major disturbances in power systems and widespread blackouts; for example, intentional cyberphysical attacks, unintentional human error, natural disasters, or accidental failures and design flaws. The impact of unintentional human errors, natural disasters, accidental failures, and design flaws can be managed and mitigated by high-quality training, improved engineering designs, targeted resilience investments and restoration drills. On the other hand, the immense technical challenges posed by cyber-physical attacks is a growing concern because of the unpredictable target, location, and scale of attacks. Accordingly, better protection for smart electrical grids against cyber-physical attacks is critically important but a substantial technical challenge.

SUMMARY

In an aspect of the present invention, there is provided a system for protection of an electrical grid, the system comprising a plurality of substations, electrical power lines between the substations, and communication channels connecting each substation to at least one other substation to communicate information, a respective one of the substations comprising: a first directional protective relay to generate a signal with a forward overreaching element operating on a respective section of the electrical power line between the respective one of the substations and a remote one of the substations; a cyber health module to receive remote signals, via a receiver over the communication channel, from two remote directional protective relays from the remote one of the substations and output a reliability signal, the reliability signal determined based on consistency of the remote signals and a status of the communication channels being operational; a circuit breaker to interrupt electrical power flow in the respective section of the electrical power line when directed; and a first comparison circuit to receive signals from the first directional protective relay, the remote directional protective relays, and from the cyber health module, and to direct the circuit breaker to interrupt electrical power flow when the reliability signal from the cyber health module indicates consistency, the first directional protective relay indicates fault, and at least one of the remote directional protective relays indicate fault.

In a particular case of the system, the system further comprising a second comparison circuit to receive a signal from the first directional protective relay and an inverted reliability signal from the cyber health module, and to direct the circuit breaker to interrupt electrical power flow after a time delay when the reliability signal from the cyber health module indicates inconsistency and the first directional protective relay indicates fault.

In another case of the system, the reliability signal of the cyber health module is inputted into a first AND gate with the forward overreaching element of the first directional protective relay and the forward overreaching element of the first directional protective relay of the remote substation, the reliability signal of the cyber health module also passes through a second time delay and a NOT gate and is inputted to a second AND gate with the forward overreaching element of the first directional protective relay, the output of the first AND gate and the second AND gate are inputted to an OR gate, the output of the OR gate is communicated to the circuit breaker to interrupt the electrical power flow of the electrical power line when the output of the OR gate is one.

In yet another case of the system, one of the remote directional protective relays comprises a directional protective relay operating on the respective section of the electrical power line with a forward underreaching element, and the other one of the remote directional protective relays comprises a second directional protective relay operating on an adjacent section of the electrical power line or adjacent element to the respective section of the electrical power line with a reverse-looking element.

In yet another case of the system, the reliability signal of the cyber health module is inputted into a first AND gate with the forward overreaching element of the first directional protective relay and the forward underreaching element of the first directional protective relay of the remote substation, the reliability signal of the cyber health module also passes through a second time delay and a NOT gate and is inputted to a second AND gate with the forward overreaching element of the first directional protective relay, the output of the first AND gate and the second AND gate are inputted to an OR gate, the output of the OR Gate is communicated to the circuit breaker to interrupt the electrical power flow of the electrical power line when the output of the OR gate is one.

In yet another case of the system, one of the remote directional protective relays comprises a directional protective relay with a reverse-looking element operating on an adjacent electrical power line or adjacent element to the respective section of the electrical power line, and the other one of the remote directional protective relays comprises a second directional protective relay operating on an adjacent section of the electrical power line or adjacent element to the respective section of the electrical power line with a forward overreaching element.

In yet another case of the system, the reliability signal of the cyber health module is inputted into a first AND gate with the forward overreaching element of the first directional protective relay after being passed through a first time delay and the reverse-looking element of the first directional protective relay of the remote substation after being passed through a NOT gate, the reliability signal of the cyber health module also passes through a second time delay and a NOT gate and is inputted to a second AND gate with the forward overreaching element of the first directional protective relay after being passed through a first time delay, the output of the first AND gate and the second AND gate are inputted to an OR gate, the output of the OR gate is communicated to the circuit breaker to interrupt the electrical power flow of the respective section of the electrical power line when the output of the OR gate is one.

In yet another case of the system, the cyber health module comprises an XNOR gate that receives the remote signals from the two remote directional protective relays as input, the output of the XNOR gate is inputted to an AND gate with the operational status of the communication channel, the output of the AND gate is the reliability signal.

In yet another case of the system, the remote signal from one of the remote directional protective relays operates on the respective section of the electrical power line and the other one of the remote directional protective relays operates on an adjacent electrical power line or adjacent element to the respective section of the electrical power line.

In yet another case of the system, the communication channels comprise redundant communication channels.

In another aspect, there is provided a cyber health module in a respective substation for protection of an electrical grid, the electrical grid comprising electrical power lines between the respective substation and remote substations and communication channels connecting the respective substation to at least one other substation, the respective substation comprising a directional relay to generate a forward overreaching signal when a fault is detected on the electrical power line, the cyber health module comprising circuitry configured to: receive remote signals, via a receiver over the communication channel, from two remote directional protective relays from the remote substations; receive a status indicator for operationality of the communication channels; and output a reliability signal determined based on consistency of the remote signals and the status indicator of the communication channels.

In a particular case of the cyber health module, the cyber health module comprises an XNOR gate that receives the remote signals from the two remote directional protective relays as input, the output of the XNOR gate is inputted to an AND gate with the operational status of the communication channel, the output of the AND gate is the reliability signal.

In another case of the cyber health module, the remote signal from one of the remote directional protective relays operates on the respective section of the electrical power line and the other one of the remote directional protective relays operates on an adjacent electrical power line or adjacent element to the respective section of the electrical power line.

In another aspect, there is provided, a method for protection of an electrical grid, the method implemented on a respective substation, the method comprising: detecting a fault on a respective section of an electrical power line connected between the respective substation and a remote substation using a forward overreaching element of a first directional protective relay; receiving remote signals from remote directional protective relays in remote substations connected to the electrical power line over a communication channel; generating a reliability signal indicating consistency of the remote signals received from the remote directional protective relays and a status of the communication channels being operational; and interrupting electrical power flow in the respective section of the electrical power line when the reliability signal from the cyber health module indicates consistency, the first directional protective relay indicates fault, and at least one of the remote directional protective relays indicate fault.

In a particular case of the method, the method further comprising interrupting electrical power flow in the respective section of the electrical power line after a second time delay when a fault is detected on the respective section of the electrical power line by the forward overreaching element of the first directional protective relay, and the reliability signal indicates inconsistency.

In another case of the method, interrupting electrical power flow in the respective section of the electrical power line comprises awaiting a first time delay prior to determining when the reliability signal from the cyber health module indicates consistency, the first directional protective relay indicates fault, and at least one of the remote directional protective relays indicate fault In yet another case of the method, the remote signals comprise a signal from a forward overreaching element of a first remote directional protective relay on the respective section of the electrical power line and a signal from a reverse-looking element of a second remote directional protective relay on an adjacent section of the electrical power line or an adjacent element.

In yet another case of the method, the remote signals comprise a signal from a forward underreaching element of a first remote directional protective relay on the respective section of the electrical power line and a signal from a reverse-looking element on a second remote directional protective relay on an adjacent section of the electrical power line or an adjacent element.

In yet another case of the method, generating a reliability signal comprises passing the remote signals from the two remote directional protective relays to an XNOR gate, the output of the XNOR gate is inputted to an AND gate with the operational status of the communication channel, the output of the AND gate is the reliability signal.

In yet another case of the method, the remote signal from one of the remote directional protective relays operates on the respective section of the electrical power line and the other one of the remote directional protective relays operates on an adjacent electrical power line or adjacent element to the respective section of the electrical power line.

These and other aspects are contemplated and described herein. It will be appreciated that the foregoing summary sets out representative aspects of embodiments to assist skilled readers in understanding the following detailed description.

BRIEF DESCRIPTION OF THE DRAWINGS

The features of the invention will become more apparent in the following detailed description in which reference is made to the appended drawings wherein.

DETAILED DESCRIPTION

Figure 1:
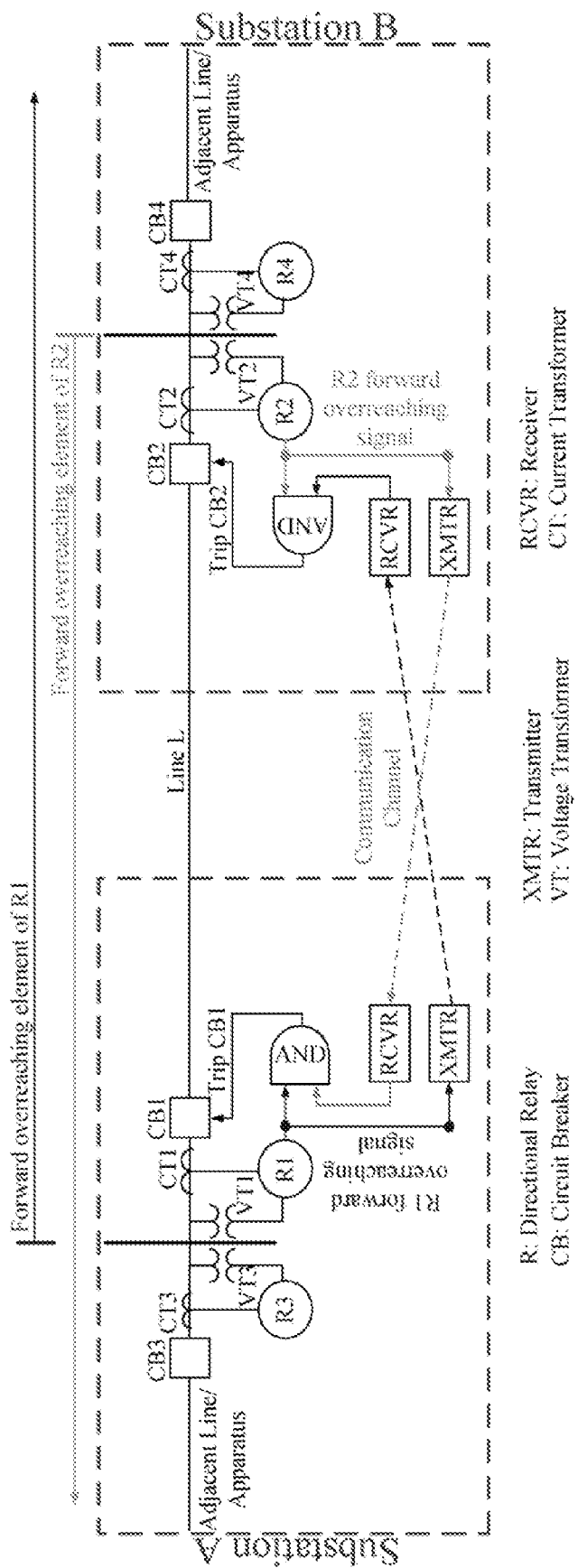
FIG. 1 illustrates a diagram of an example of a basic logic for a POTT protection scheme.

Embodiments will now be described with reference to the figures. For simplicity and clarity of illustration, where considered appropriate, reference numerals may be repeated among the Figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, well-known methods, procedures and components have not been described in detail so as not to obscure the embodiments described herein. Also, the description is not to be considered as limiting the scope of the embodiments described herein.

Various terms used throughout the present description may be read and understood as follows, unless the context indicates otherwise: "or" as used throughout is inclusive, as though written "and/or"; singular articles and pronouns as used throughout include their plural forms, and vice versa; similarly, gendered pronouns include their counterpart pronouns so that pronouns should not be understood as limiting anything described herein to use, implementation, performance, etc. by a single gender; "exemplary" should be understood as "illustrative" or "exemplifying" and not necessarily as "preferred" over other embodiments. Further definitions for terms may be set out herein; these may apply to prior and subsequent instances of those terms, as will be understood from a reading of the present description.

Any module, unit, component, server, computer, terminal, engine or device exemplified herein that executes instructions may include or otherwise have access to computer readable media such as storage media, computer storage media, or data storage devices (removable and/or non-removable) such as, for example, magnetic disks, optical disks, or tape. Computer storage media may include volatile and non-volatile, removable and non-removable media implemented in any method or technology for storage of information, such as computer readable instructions, data structures, program modules, or other data. Examples of computer storage media include RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by an application, module, or both. Any such computer storage media may be part of the device or accessible or connectable thereto. Further, unless the context clearly indicates otherwise, any processor or controller set out herein may be implemented as a singular processor or as a plurality of processors. The plurality of processors may be arrayed or distributed, and any processing function referred to herein may be carried out by one or by a plurality of processors, even though a single processor may be exemplified. Any method, application or module herein described may be implemented using computer readable/executable instructions that may be stored or otherwise held by such computer readable media and executed by the one or more processors.

The following relates generally to protection of electric power transmission and distribution grids; and more specifically, to a system and method for protection of an electrical grid.

A comprehensive review of the root causes of major power system blackouts and large system disturbances indicates that protective relays misoperation has played an important role in most cases. This is mainly because protective relays form the most critical and fastest line of defence against power system faults and disturbances. Protection approaches generally automatically detect abnormal conditions and signal the appropriate circuit breakers or relays in a timely and coordinated fashion to isolate the least number of apparatus containing the faulty equipment. Misoperation or delayed operation of protective relays can have serious consequences for power system security and stability. Moreover, sustained faults can seriously damage and even destroy critical assets like transformers. The replacement of critical assets that are damaged by sustained faults may hamper the electric power restoration for weeks or months. Thus, it is imperative to have cyber-resilient protective relays as they represent one of the most vital protection and control aspects of power systems to be protected against cyberattacks; particularly during faults and major disturbances.

Industrial control systems (ICS), including substation monitoring, control, and protection systems, have been moving away from proprietary systems towards more open and interoperable systems with remote access connections. In this environment, the International Electrotechnical Commission (IEC) 61850 protocol and the industrial internet of things are expected to play a vital role in streamlining substation automation and analytics in order to improve reliability, reduce costs, and increase efficiency. However, these changes are highly likely to increase the risks of cybersecurity attacks and breaches. In many cases, the application of cybersecurity techniques, like encryption, may not be possible or feasible due to limited processing capabilities of intelligent electronic devices (IEDs) and due to the time-critical nature of processes in ICS. Thus, cyber attackers may be able to use unprotected remote connections embedded in digital technologies to covertly connect to protective relays, and, for example, install a malicious agent to automatically execute an attack during power system faults and disturbances.

Advantageously, the present embodiments provide a cyber-resilient approach using directional comparison protection schemes. Advantageously, the present embodiments can protect against both false data injection (FDI) and distributed denial of service (DDoS) attacks, as well as communication channel loss. In embodiments of the present disclosure, a directional element of two separate relays can communicate over a communication channel. The corroboration of these two protection relays can be used to identify whether the protection relay is compromised by a cyberattack. Advantageously, the present embodiments can be used to significantly improve the cyber-resiliency of communication-assisted protection schemes.

Communication-assisted protection schemes are vital in high voltage transmission lines because overcurrent and distance protection relays are generally unable to meet the need for high speed fault clearing. In addition, sub-transmission systems are also becoming more dependent on communication-assisted protection schemes. The increased number of short lines, looped lines, multi-terminal and multi-tapped lines in sub-transmission systems has complicated the possibility of satisfying sensitivity, time response, selectivity and reliability requirements for fault clearing without using communication-assisted protection schemes. High-speed fault clearing is desirable in bulk power systems because it preserves system stability, reduces damage to critical assets, improves power quality, and simplifies protection relays coordination.

The implementation of the communication-assisted protection schemes is likely to significantly increase in active distribution systems as the number of distributed energy resources (DERs) and microgrids grow. This is practical in particular due to the development of cost-effective digital communication equipment and channels. High-speed fault clearing is necessary for modern distribution systems due to the emergence of the microgrids, DERs, smart loads, electric vehicles (EVs), and microprocessor-based home appliances and industrial sensors. The electronically-interfaced DERs, smart loads, EVs and microprocessor-based apparatus are generally sensitive to voltage sags caused by faults and may disconnect from the grid by delayed fault clearing. Induction motors are also generally sensitive to voltage drop and lose speed rapidly during a fault-caused voltage sag. This may exacerbate the problems caused by delayed fault clearing and even cause other problems like sympathetic protection tripping and blackout in islanded microgrids.

Directional comparison protection schemes are generally more desirable and prevalent in power systems compared to differential schemes. Directional comparison protection schemes offer low communication channel requirements and have inherent redundancy and backup characteristics. The redundancy and backup characteristics of directional comparison protection schemes comes from the capability of directional distance and overcurrent relays at each terminal to provide instantaneous or delayed protection which is independent of the communication-assisted tripping logic.

Directional comparison schemes generally use a communication channel to exchange information about the direction of a fault. If the fault direction is into the line at all line terminals, the fault is internal and a trip signal is issued. Otherwise, the fault is external and the tripping signal is blocked. There are many variations of directional comparison protection schemes; for example: (1) permissive overreaching transfer trip (POTT), (2) permissive underreaching transfer trip (PUTT), (3) direct transfer trip (DTT), direct underreaching transfer trip (DUTT), directional comparison blocking (DCB), and directional comparison unblocking (DCUB). The above-mentioned protection schemes may be classified into two classes: (1) transfer tripping schemes, and (2) blocking schemes. In transfer tripping schemes, the communication channel is used to transmit a permissive tripping instruction to the remote relay. In the blocking schemes, the communication channel is used to transmit a blocking instruction to the remote relay.

A notable distinction between transfer tripping schemes and blocking schemes is the dependence of their reliability on the availability of the communication channel. Protection scheme reliability can be conceptually thought of as consisting of two aspects: (1) dependability and (2) security. Dependability is concerned with the ability of the protection scheme to operate correctly for faults within its intended zone of protection. Security is concerned with the ability of the protection scheme not to misoperate for faults outside of its intended zone of protection.

The transfer tripping schemes are generally very secure in that they do not trip for external faults if the communication channel is inoperative. Conversely, these schemes are generally lacking in dependability because they will not operate for internal faults if the communication channel is inoperative. In some cases, distance/overcurrent relays involved in the transfer tripping schemes can clear the internal faults with a time delay.

The blocking schemes are generally very dependable because they will operate for internal faults even if the communication channel is inoperative. Conversely, these schemes are generally less secure than transfer tripping schemes because they will trip for external faults within reach of the tripping functions if the communication channel is inoperative. Thus, the communication channel is likely more reliable in the blocking schemes in comparison to the transfer tripping schemes.

Embodiments described herein will generally focus on POTT, PUTT and DCB protection schemes. POTT and PUTT being transfer tripping schemes, while DCB being a blocking scheme. However, it is understood that any suitable protection scheme can be used.

The POTT, PUTT and DCB protection schemes generally work based on exchanging information on the status of directional elements of protective relays using a communication channel. The POTT and PUTT protection schemes are transfer tripping schemes since they use a communication channel to transmit a permissive tripping signal between directional protective relays in substations. The DCB protection scheme is a blocking scheme since it uses a communication channel to transmit a blocking signal between directional protective relays in substations.

FIG. 1 illustrates a diagram of an example of a basic logic for the POTT protection scheme. The POTT protection scheme trips the circuit breaker at each end of a protected line 'L' immediately after receiving forward overreaching signals from both local and remote relays. In other words, the POTT logic allows the forward overreaching element of the local relay to trip the circuit breaker of the protected line instantaneously upon the receipt of the permissive overreaching trip signal from the remote end of the line. The permissive overreaching trip signal from the remote end of the protected line is communicated through a communication channel.

Figure 3:
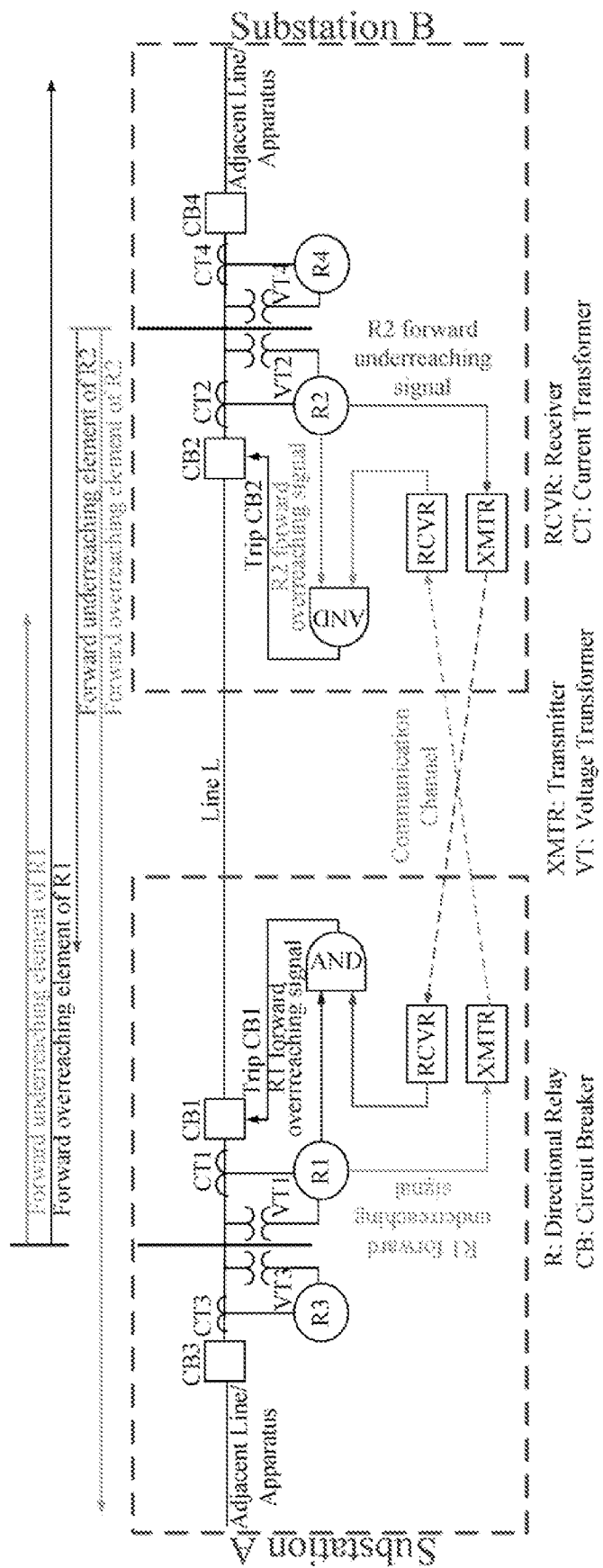
FIG. 3 illustrates a diagram of an example of a basic logic for a PUTT protection scheme.

FIG. 3 illustrates a diagram of an example of a basic logic for the PUTT protection scheme. The PUTT protection scheme trips the circuit breaker at each end of a protected when the forward overreaching element of the local relay operates and the forward underreaching signal is received from the remote relay. In other words, the PUTT logic allows the forward overreaching element of the local relay to trip the circuit breaker of the protected line instantaneously upon the receipt of the permissive underreaching trip signal from the remote end of the line. The permissive underreaching trip signal from the remote end of the protected line is communicated through a communication channel.

Figure 5:
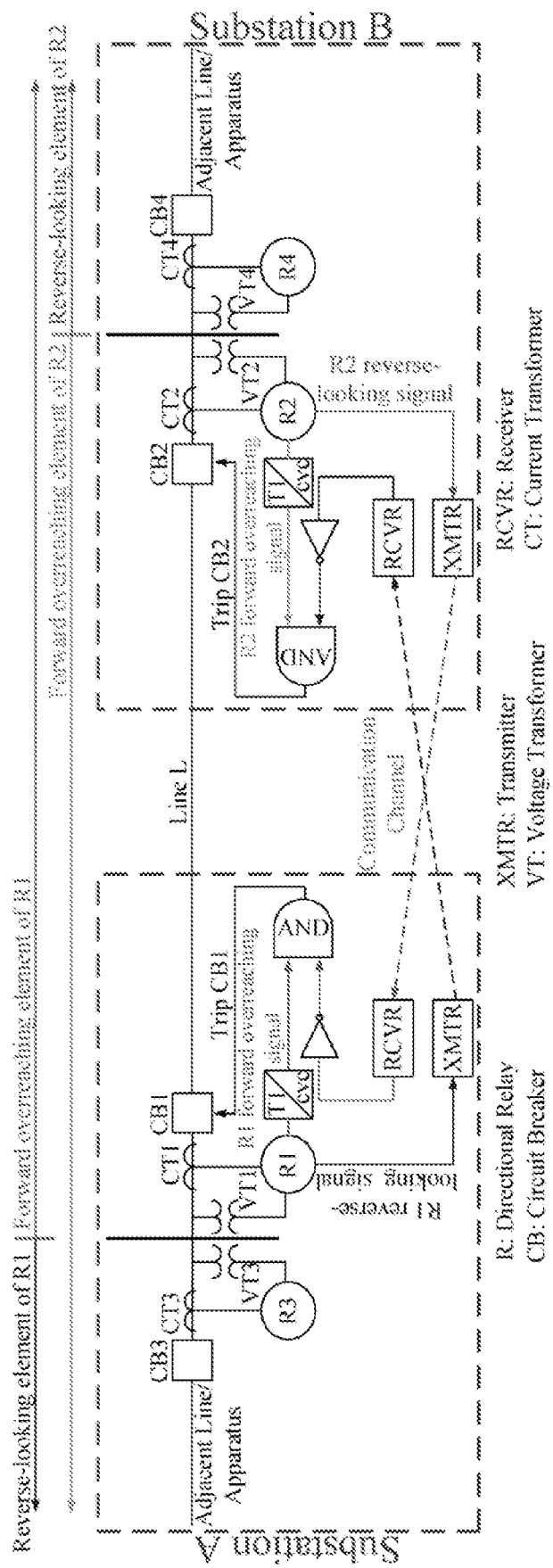
FIG. 5 illustrates a diagram of an example of a basic logic for the DCB protection scheme.

FIG. 5 illustrates a diagram of an example of a basic logic for the DCB protection scheme. The DCB protection scheme trips the circuit breaker at each end of a protected line 1' when the forward overreaching element of the local relay operates and no signal is received from the reverse-looking element of the remote relay. In other words, the DCB logic blocks the forward overreaching element of the local relay from tripping the circuit breaker upon the receipt of the blocking signal from the relay at the remote end of the line. The reverse-looking element of the relays must be set to reach further behind the terminal than the forward overreaching element. The blocking signal from the remote end of the protected line is communicated through a communication channel. Therefore, a short time delay (represented as T1 in FIG. 5) is required to compensate for communication channel time delay, signal propagation time, and the like.

In the present embodiments, forward overreaching elements of a directional protective relay can be used to detect a fault in the forward direction within the protected and overreaches to a section of the adjacent lines and/or elements. Forward underreaching elements of a directional protective relay can be used to detect a fault within the protected line 1' in the forward direction and provide coverage for less than all of the protected line Reverse looking elements of a directional protective relay can be used to detect a fault in the reverse looking direction of the protected and cover the adjacent lines and/or elements behind the relay.

Figure 2:
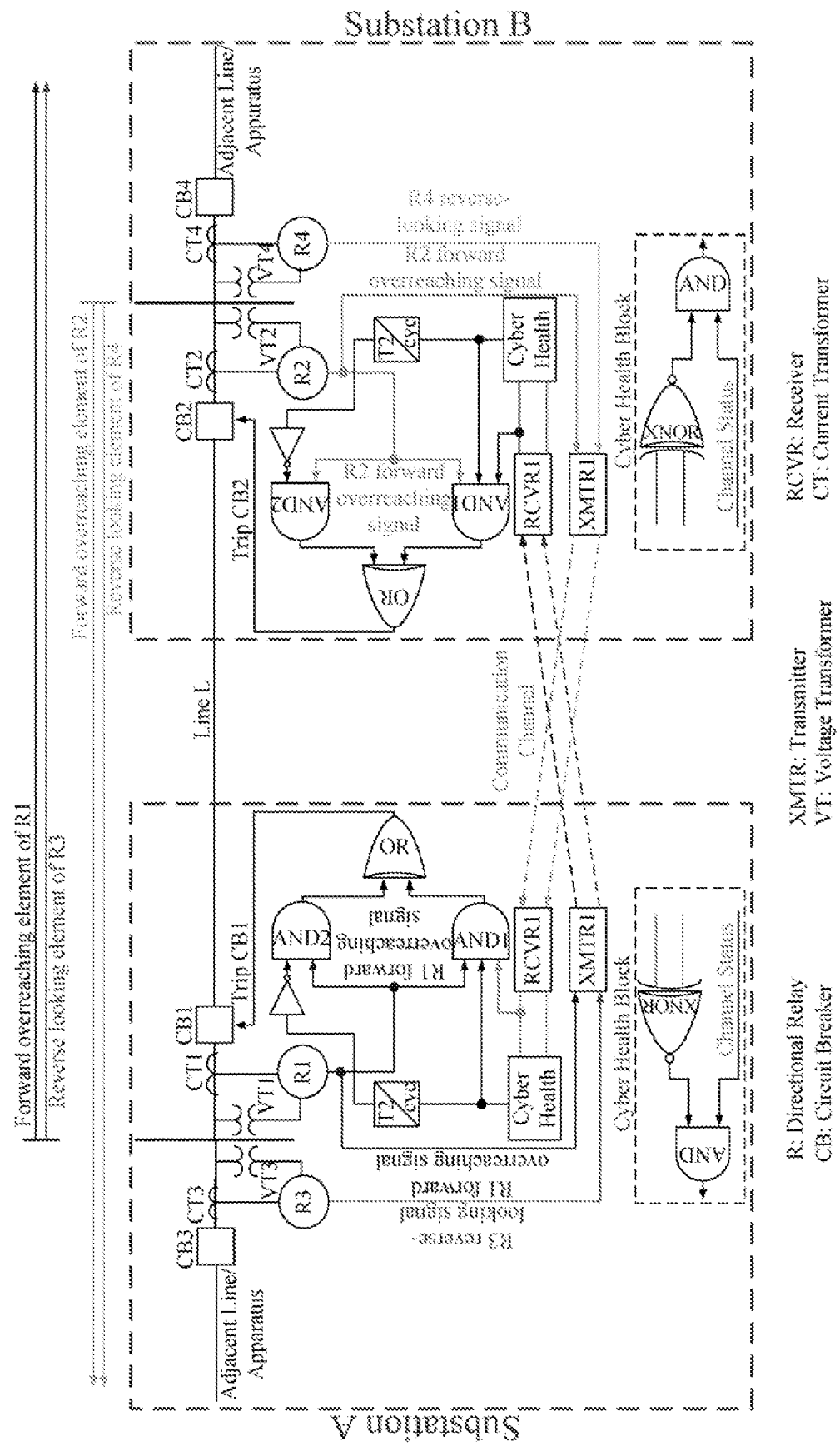
FIG. 2 illustrates an example logic diagram for a cyber-resilient POTT protection scheme, in accordance with an embodiment.

FIG. 2 illustrates an example of logic for a cyber-resilient POTT protection scheme, in accordance with an embodiment. In this protection scheme, for each substation, there are two AND gates (AND1 and AND2), a cyber health module, one NOT gate, and one OR gate. The AND1 gate employs the same logic as the POTT logic of FIG. 1, where the forward overreaching signals from both local and remote relays are employed to trip the circuit breaker. In this protection scheme, the cyber health module is used to confirm the cyber health of the system before the AND1 gate trips the circuit breaker.

The cyber health module receives the forward overreaching and reverse-looking element of two remote relays through a communication channel and cross checks the consistency of these two signals using a XNOR gate. Such communication channels can include, for example, dedicated fiber optic cable, multiplexed fiber optic systems (T1 and SONET), phone lines, power line carrier, radio channels, and the like. The XNOR gate verifies that the remote relay or the communication channel is not compromised by a cyberattack by confirming consistency. Thus, the AND1 gate operates when the forward overreaching element of the local and remote relays are present and the cyber health module output is 1. It is noteworthy that the status of the cyber health module output is 0 when the communication channel is lost or the signals received from the communication channel are not consistent. Otherwise, the status of the cyber health module output is 1. In some cases, the AND2 gate can operate with a short time delay T2 if the status of the cyber health module output is 0 and the forward overreaching element of the local relay is present. The time delay T2 can be used to avoid over-tripping because if the fault is on the adjacent lines and/or elements, the protective relays of the adjacent lines and/or elements will generally clear the fault faster than the time delay T2; thus, the cyber-resilient POTT protection will not detect the fault after the time delay T2 to trip the line 'L'. Moreover, if the fault is indeed on the line the cyber-resilient POTT protection will trip the line L after the time delay T2 which is generally faster than using basic POTT techniques. The T2 time delay can be chosen such that it is longer than the instantaneous tripping of main protection relays of adjacent lines/and/or apparatuses. Since the main protection relays of the adjacent lines and/or elements generally operate in 1 to 3 cycles (for example, 20 to 50 milliseconds in a 60 HZ power system), the time delay T2 can, in some cases, be chosen above 3 cycles (for example, 50 milliseconds in a 60 HZ power system).

Advantageously, the present embodiment of the cyber-resilient POTT protection scheme allows fast circuit breaker tripping when local and remote forward overreaching elements are present and the cyber health of the system is confirmed by the cyber health module. The scheme also allows fast circuit breaker tripping when the output of the cyber health module is zero and the forward overreaching element of the local relay is present.

Figure 4:
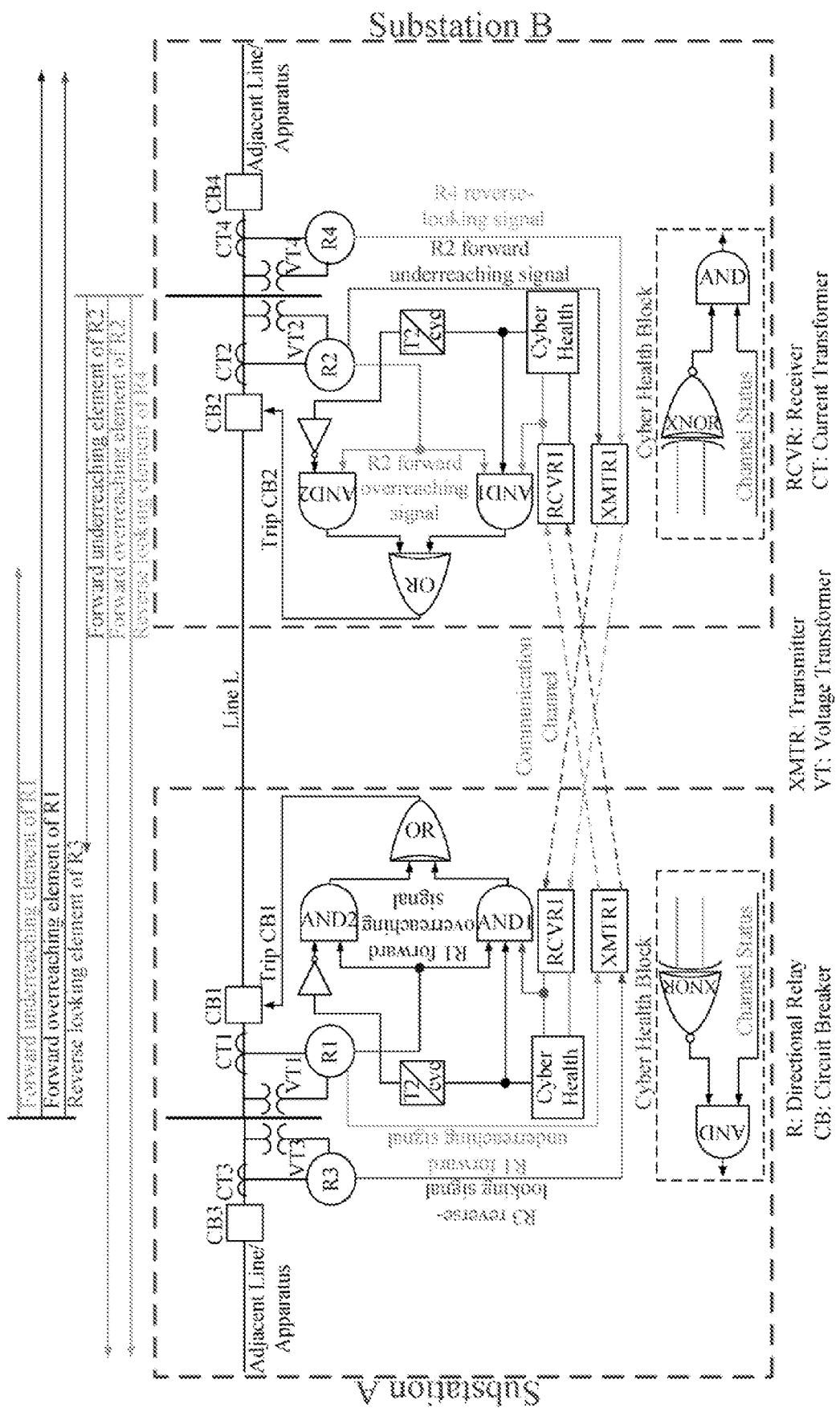
FIG. 4 illustrates an example of logic for a cyber-resilient PUTT protection scheme, in accordance with an embodiment.

FIG. 4 illustrates an example of logic for a cyber-resilient PUTT protection scheme, in accordance with an embodiment. In this protection scheme, there are two AND gates (AND1 and AND2), a cyber health module, one NOT gate and one OR gate. The AND1 gate employs the same logic as the PUTT logic of FIG. 3, where the forward overreaching signal from the local relay and the forward underreaching signal from the remote relay are employed to trip the circuit breaker. In contrast, in this protection scheme, the cyber health module is used to also confirm the cyber health of the system before the AND1 gate trips the circuit breaker. The cyber health module receives the forward underreaching and reverse-looking element of two remote relays through a communication channel and cross checks the consistency of these two signals using a XNOR gate. The XNOR gate verifies that the remote relay or the communication channel is not compromised by a cyberattack by confirming consistency. Thus, the AND1 gate operates when the forward overreaching element of the local relay and the forward underreaching element of the remote relay are present and the output of the cyber health module is 1. It is noteworthy that the output of the cyber health module output is 0 when the communication channel is lost or the signals received from the communication channel are not consistent. Otherwise, the output of the cyber health module output is 1. In some cases, the AND2 gate can operate with a short time delay T2 if the output of the cyber health module output is 0 and the forward overreaching element of the local relay is present. The time delay T2 can be used to avoid over-tripping. The T2 time delay can be chosen such that it is longer than the instantaneous tripping of main protection relays. Advantageously, the present embodiment of the cyber-resilient PUTT protection scheme allows fast circuit breaker tripping when the forward overreaching element of the local relay and the forward underreaching element of the remote relay are activated and the cyber health of the system is confirmed by the cyber health module. The scheme also allows fast circuit breaker tripping when the output of the cyber health module is zero and the forward overreaching element of the local relay is activated.

Figure 6:
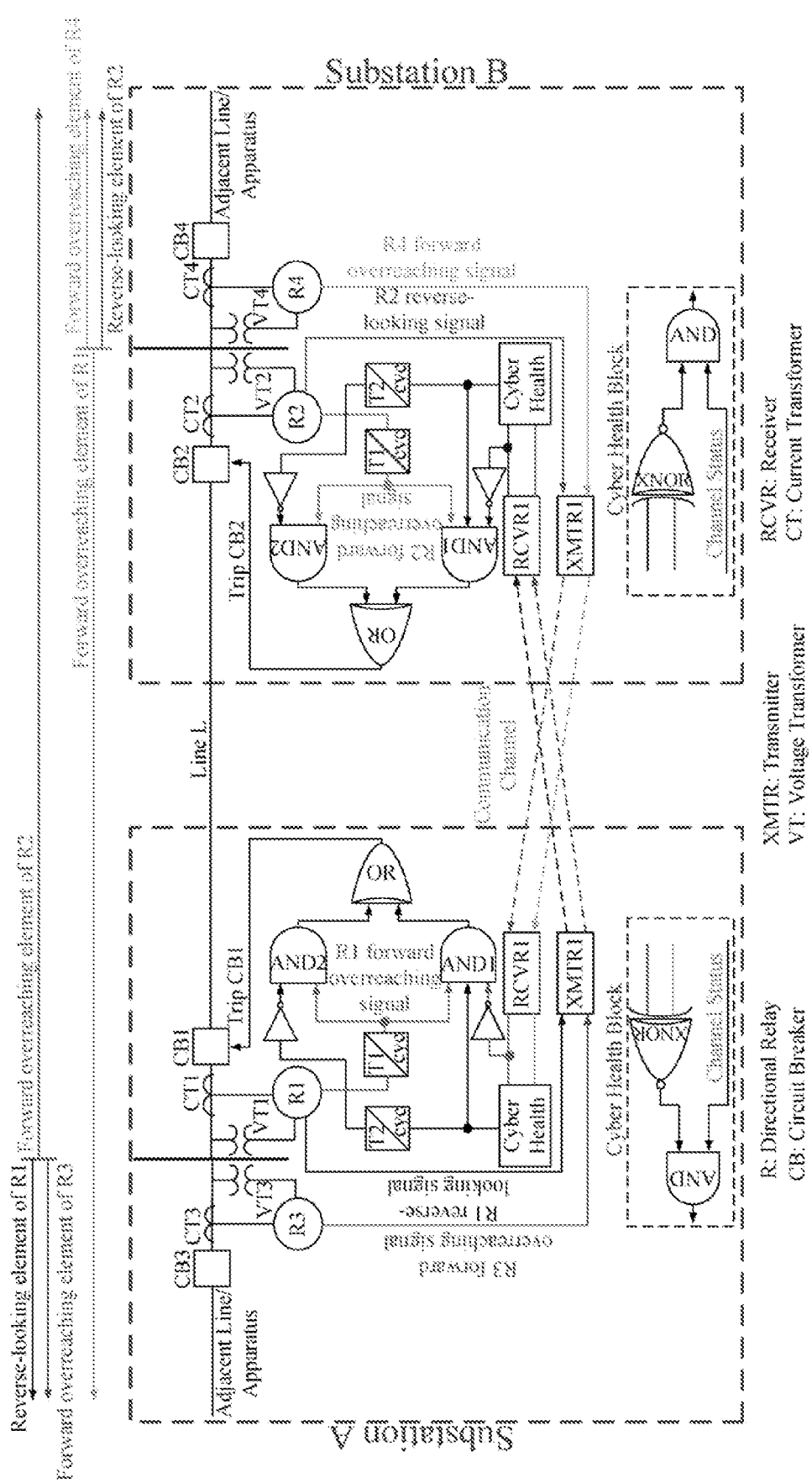
FIG. 6 illustrates an example of logic for a cyber-resilient DCB protection scheme, in accordance with an embodiment.

FIG. 6 illustrates an example of logic for a cyber-resilient DCB protection scheme, in accordance with an embodiment. The AND1 gate employs the same logic as the DCB logic in FIG. 5, where the forward overreaching element of the local relay trips the circuit breaker when no signal is received from the reverse-looking element of the remote relay. In some cases, a short time delay (represented as T1 in FIG. 6) can also be used to compensate for communication channel time delay similar to DCB protection logic of FIG. 5. In contrast to FIG. 5, in this protection scheme, a cyber health module is used to confirm the cyber health of the system before the AND1 gate trips the circuit breaker. The cyber health module receives the reverse-looking and forward overreaching element of two remote relays through a communication channel and cross checks the consistency of these two signals using a XNOR gate. The XNOR gate verifies that the remote relay or the communication channel is not compromised by a cyberattack by confirming consistency. Thus, the AND1 gate operates when the forward overreaching element of the local relay is activated, the output of the cyber health module is 1 and no blocking signal is received from the reverse-looking element of the directional protective relay in the remote substation. Similar to the scheme of FIG. 2, the output of the cyber health module output is 0 when the communication channel is lost or the signals received from the communication channel are not consistent. Otherwise, the output of the cyber health module output is 1. In some cases, an AND2 gate operates with a short time delay T2 if the output of the cyber health module output is 0 and the forward overreaching element of the local relay is activated. The T2 time delay can be chosen such that it is longer than the instantaneous tripping of main protection relays of the adjacent lines and/or elements, which, in some cases, can be in the range of 1 to 3 cycles (for example, 20 milliseconds to 50 milliseconds for a 60 HZ power system).

The transfer tripping schemes of POTT and PUTT are generally very secure because, for example, they do not trip for external faults if the communication channel is inoperative. However, these schemes generally do not operate for internal faults if the communication channel is inoperative. In some cases, distance and/or overcurrent relays involved in the transfer tripping schemes can clear the internal faults with a time delay.

The blocking scheme of DCB is generally very dependable because they will operate for internal faults even if the communication channel is inoperative. However, this scheme is generally less secure than transfer tripping schemes because it may trip for external faults within reach of the tripping functions if the communication channel is inoperative. Thus, the communication channel is likely more reliable in the blocking schemes in comparison to the transfer tripping schemes.

Figure 7:
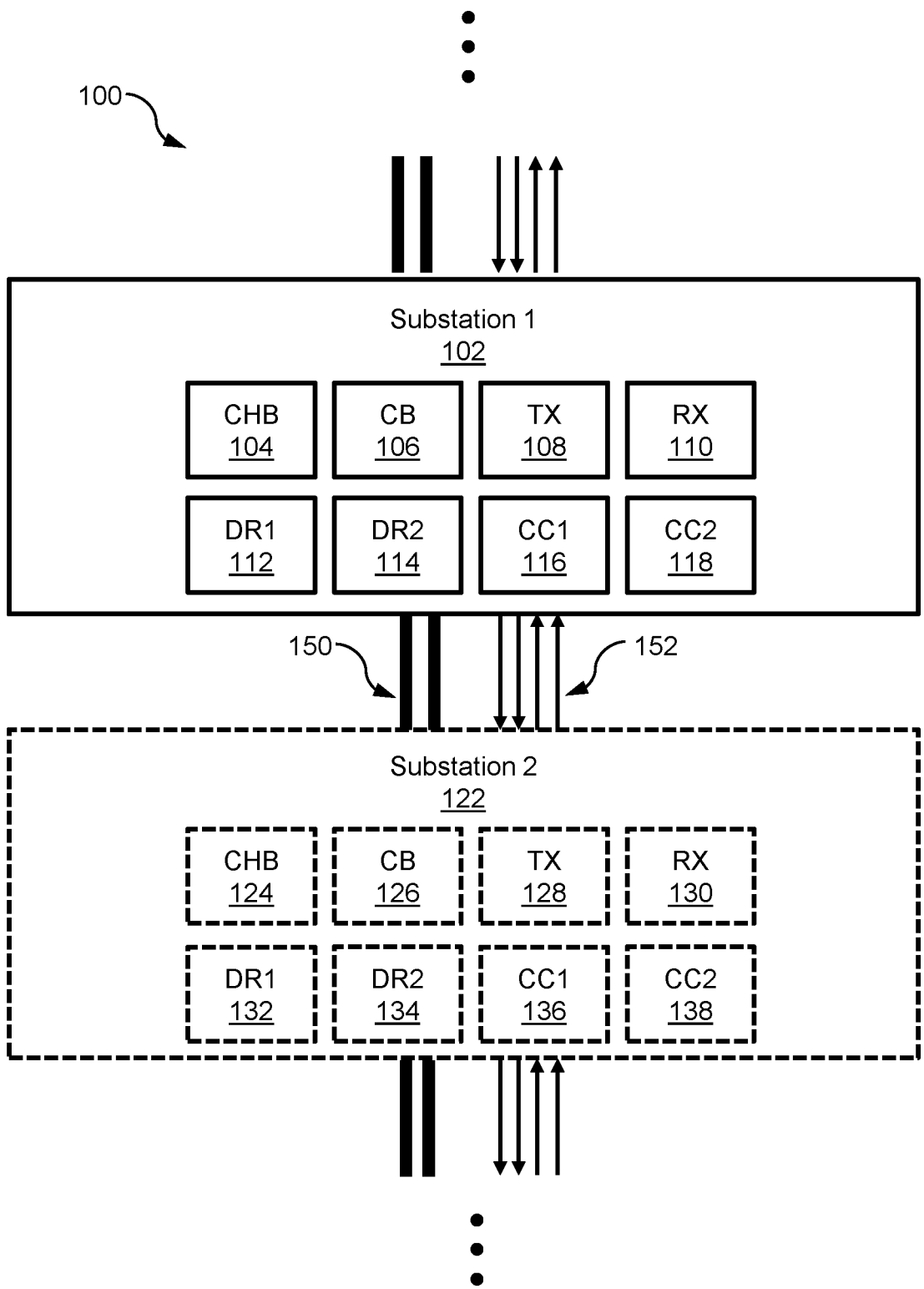
FIG. 7 is schematic diagram of a system for protection of an electrical grid, according to an embodiment.

FIG. 7 illustrates a conceptual diagram of a system 100 for protection of an electrical grid, in accordance with an embodiment. The system comprises a plurality of substations; in the example of FIG. 7, two substations are illustrated: a first substation 102 and a second substation 122. The first substation 102 and the second substation 122 each comprise a cyber health module 104, 124 (respectively), a circuit breaker 106, 126 (respectively), a transmitter 108, 128 (respectively), a receiver 110, 130 (respectively). The first substation 102 also includes a first directional protective relay 112, a second directional protective relay 114, a first comparison circuit 116, and a second comparison circuit 118. The second substation 122 also includes a first directional protective relay 132, a second directional protective relay 134, a first comparison circuit 136, and a second comparison circuit 138. The directional protective relays 112, 114, 132, 134 comprise circuitry to communicate state; i.e., send a signal or otherwise communicate with other elements when they are activated. The electrical power line 150 interconnects the substations 102, 122. The communication channel 152 is located between the first substation 102 and the second substation 122. In further examples, the second substation can be electrically connected to and in communication with further substations in the grid. In this embodiment, the first directional protective relays 112 and 132 are used to protect the power line 150, and the second protective relays 114, 134 protects adjacent lines and/or elements to the power line 150 in the respective substation 102, 122.

Figure 8:
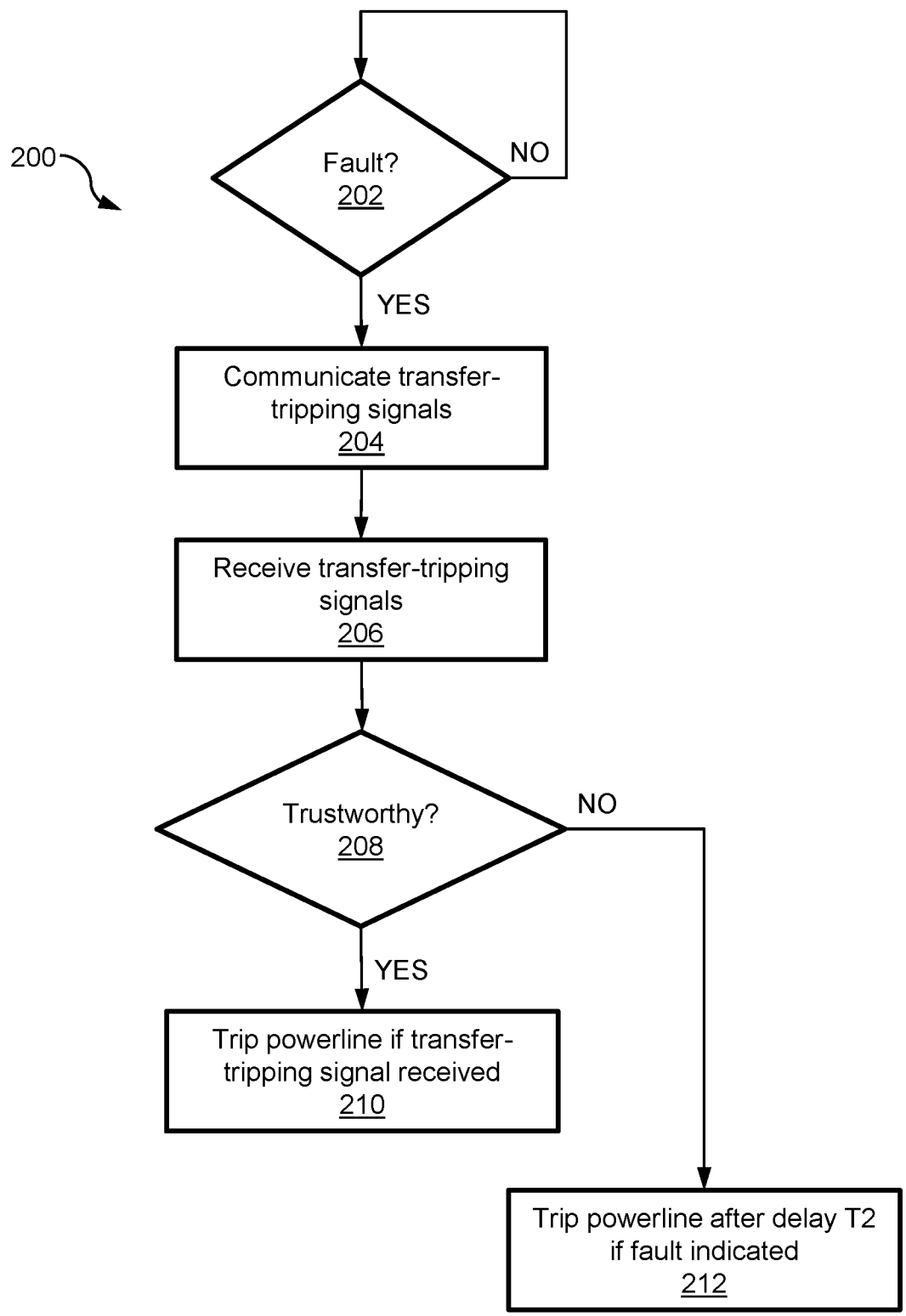
FIG. 8 is a flowchart for a method for protection of an electrical grid, according to an embodiment, using transfer-tripping schemes.

FIG. 8 illustrates a method 200 for protection of an electrical grid, in accordance with an embodiment. This embodiment uses transfer tripping schemes, such as POTT and PUTT. For the purposes of illustration, the first substation 102 is considered as a "local" substation and the second substation 122 is considered as a "remote" substation. Without loss of generality, either of the first and second substations 102, 122 can be considered as the local or remote substation, and the method 200 can be performed concurrently on both substations. At block 202, the first directional protective relay 112 of the first substation 102 monitors for a fault on the electrical power line 150 between the first substation 102 and the second substation 122 using a forward overreaching element. When a fault is detected, at block 204, transfer-tripping signals are transmitted with the transmitter 128, over the communication channel 152, from the first directional relay 132 and the second directional relay 134 of the second substation 122 via their forward overreaching or underreaching element and reverse looking element, respectively. At block 206, the cyber health module 104 of the first substation 102, via the receiver 110, receives the transfer-tripping signals from the directional protective relays 132 and 134 in the second substation 122 sent over the communication channel 152.

At block 208, the cyber health module 104 determines and outputs a reliability signal indicating whether the transfer-tripping signals received from the second substation 122 are trustworthy or untrustworthy. The cyber health module 104 determines trustworthiness to determine the reliability signal by comparing consistency of the multiple transfer-tripping signals received from the second substation 122. In most cases, the cyber health module 104 can further determine trustworthiness by determining whether a status for the communication channel 152 is operational.

At block 210, the first comparison circuit 116 of the first substation 102 communicates a tripping signal to the circuit breaker 106 to interrupt electrical power flow on the electrical power line 150 when receiving (1) the transfer-tripping signal from the second substation 122, via the receiver 110 indicating a fault, (2) the reliability signal from the cyber health module 104 indicates that the transfer-tripping signal is trustworthy, and (3) a signal indicating that the forward overreaching element of the first directional protective relay 112 indicates a fault.

At block 212, in some cases, the second comparison circuit 118 of the first substation communicates a tripping signal to the circuit breaker 106 to trip the electrical power line 150 when both (1) the reliability signal from the cyber health module 104 indicates that the transfer tripping signal from the second substation 122 is untrustworthy and (2) the forward overreaching element of the first directional protective relay 112 indicates a fault after a time delay 'T2'.

Figure 9:
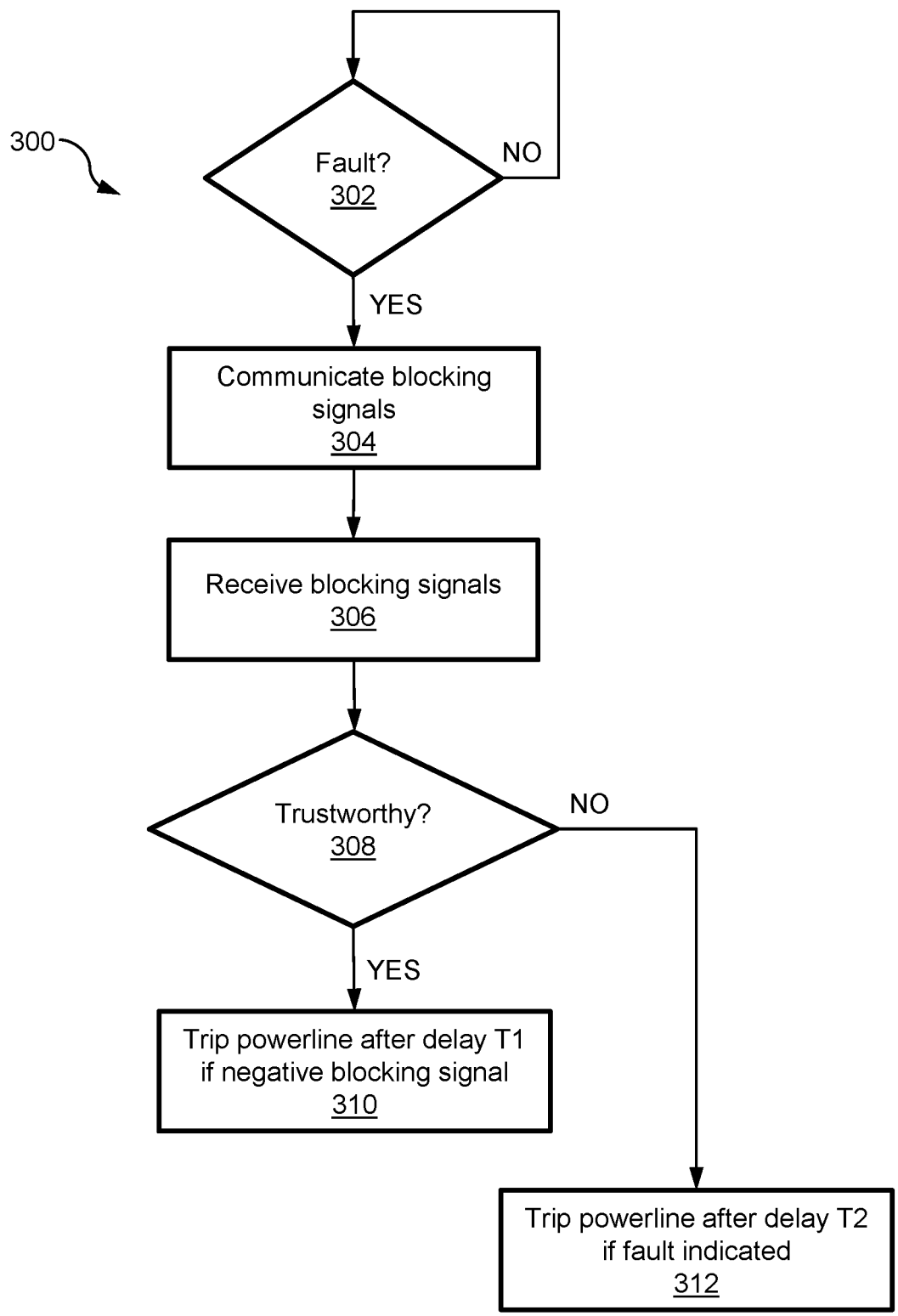
FIG. 9 is a flowchart for a method for protection of an electrical grid, according to an embodiment, using blocking schemes.

FIG. 9 illustrates a method 300 for protection of an electrical grid, in accordance with an embodiment. This embodiment uses blocking schemes, such as DCB. For the purposes of illustration, the first substation 102 is considered as a "local" substation and the second substation 122 is considered as a "remote" substation. Without loss of generality, either of the first and second substations 102, 122 can be considered as the local or remote substation, and the method 200 can be performed concurrently on both substations.

At block 302, the first directional protective relay 112 of the first substation 102 monitors for a fault on the electrical power line 150 between the first substation 102 and the second substation 122 using a forward overreaching element. When a fault is detected, at block 304, blocking signals are transmitted with the transmitter 128, over the communication channel 152, from the first directional relay 132 and the second directional relay 134 of the second substation via their reverse looking element and forward overreaching element, respectively. At block 306, the cyber health module 104 of the first substation 102, via the receiver 110, receives the blocking signals from the directional protective relays 132 and 134 in the second substation 122 sent over the communication channel 152.

At block 308, the cyber health module 104 determines and outputs a reliability signal indicating whether the blocking signals received from the second substation are trustworthy or untrustworthy. The cyber health module 104 determines trustworthiness to determine the reliability signal by comparing consistency of the multiple blocking signals received from the second substation 122. In most cases, the cyber health module 104 can further determine trustworthiness by determining whether a status for the communication channel 152 is operational.

At block 310, the first comparison circuit 116 of the first substation 102 receives the blocking signal from the second substation 122 sent over the communication channel 152. The first comparison circuit 116 communicates a tripping signal to the circuit breaker 106 to interrupt electrical power flow on the electrical power line 150 when there is (1) no blocking signal after a time delay 'T1', (2) the reliability signal from the cyber health module 104 indicates that the blocking signals from the second substation 122 are trustworthy, and (3) the forward overreaching element of the first directional protective relay 112 indicates a fault.

At block 312, in some cases, the second comparison circuit 118 of the first substation 102 communicates a tripping signal to the circuit breaker 106 to trip the electrical power line 150 when receiving both (1) the reliability signal from the cyber health module 104 that the blocking signal from the second substation 122 is untrustworthy and (2) a signal indicating that the forward overreaching element of the first directional protective relay 112 indicates a fault after a time delay 'T2'.

While the present embodiments illustrate two remote signals from a remote substation, it should be appreciated that consistency can be checked over three or more signals with various appropriate combinations of forward and reverse looking signals.

In some of the above cases, the signals from two relays in two substations are cross checked to identify whether the communication channel or the relays are compromised by a cyberattack. Advantageously, since an attacker would not have knowledge about the two relays whose directional elements are cross-checked, it would be extraordinarily difficult for the attacker to compromise both relays. In this way, the system can cross check the directional elements of different protective relays to verify the cyber health of the communication channel. Thus, in further embodiments, the system can be used in combination with any directional element and any number of protective relays. In some cases, the system can include communication channel redundancy to further improve the cyber-resiliency of the schemes. In some cases, security filters can be used to authenticate communication between the local and remote relays and improve the cyber-resiliency of the communication channel in the communication-assisted protection schemes.

Although the invention has been described with reference to certain specific embodiments, various modifications thereof will be apparent to those skilled in the art without departing from the spirit and scope of the invention as outlined in the claims appended hereto. The entire disclosures of all references recited above are incorporated herein by reference.

The invention claimed is:

1. A system for protection of an electrical grid, the system comprising a plurality of substations, electrical power lines between the plurality of substations, and communication channels connecting each substation to at least one other substation to communicate information, a respective one of the substations comprising:

a first directional protective relay to generate a signal with a forward overreaching element operating on a respective section of the electrical power line between the respective one of the substations and a remote one of the substations;

a cyber health module to receive remote signals, via a receiver over the communication channel, from two remote directional protective relays from the remote one of the substations and output a reliability signal, the reliability signal determined based on consistency of the remote signals and a status of the communication channels being operational;

a circuit breaker to interrupt electrical power flow in the respective section of the electrical power line when directed; and a first comparison circuit to receive signals from the first directional protective relay, the remote directional protective relays, and from the cyber health module, and to direct the circuit breaker to interrupt electrical power flow when the reliability signal from the cyber health module indicates consistency, the first directional protective relay indicates fault, and at least one of the remote directional protective relays indicate fault.

2. The system of claim 1, further comprising a second comparison circuit to receive a signal from the first directional protective relay and an inverted reliability signal from the cyber health module, and to direct the circuit breaker to interrupt electrical power flow after a time delay when the reliability signal from the cyber health module indicates inconsistency and the first directional protective relay indicates fault.

3. The system of claim 1, wherein one of the remote directional protective relays comprises a first directional protective relay operating on the respective section of the electrical power line with a forward overreaching element, and the other one of the remote directional protective relays comprises a second directional protective relay operating on an adjacent section of the electrical power line or adjacent element to the respective section of the electrical power line with reverse-looking element.

4. The system of claim 3, wherein the reliability signal of the cyber health module is inputted into a first AND gate with the forward overreaching element of the first directional protective relay and the forward overreaching element of the first directional protective relay of the remote substation, the reliability signal of the cyber health module also passes through a second time delay and a NOT gate and is inputted to a second AND gate with the forward overreaching element of the first directional protective relay, the output of the first AND gate and the second AND gate are inputted to an OR gate, the output of the OR gate is communicated to the circuit breaker to interrupt the electrical power flow of the electrical power line when the output of the OR gate is one.

5. The system of claim 1, wherein one of the remote directional protective relays comprises a directional protective relay operating on the respective section of the electrical power line with a forward underreaching element, and the other one of the remote directional protective relays comprises a second directional protective relay operating on an adjacent section of the electrical power line or adjacent element to the respective section of the electrical power line with a reverse-looking element.

6. The system of claim 5, wherein the reliability signal of the cyber health module is inputted into a first AND gate with the forward overreaching element of the first directional protective relay and the forward underreaching element of the first directional protective relay of the remote substation, the reliability signal of the cyber health module also passes through a second time delay and a NOT gate and is inputted to a second AND gate with the forward overreaching element of the first directional protective relay, the output of the first AND gate and the second AND gate are inputted to an OR gate, the output of the OR Gate is communicated to the circuit breaker to interrupt the electrical power flow of the electrical power line when the output of the OR gate is high.

7. The system of claim 1, wherein one of the remote directional protective relays comprises a directional protective relay with a reverse-looking element operating on an adjacent electrical power line or adjacent element to the respective section of the electrical power line, and the other one of the remote directional protective relays comprises a second directional protective relay operating on an adjacent section of the electrical power line or adjacent element to the respective section of the electrical power line with a forward overreaching element.

8. The system of claim 7, wherein the reliability signal of the cyber health module is inputted into a first AND gate with the forward overreaching element of the first directional protective relay after being passed through a first time delay and the reverse-looking element of the first directional protective relay of the remote substation after being passed through a NOT gate, the reliability signal of the cyber health module also passes through a second time delay and a NOT gate and is inputted to a second AND gate with the forward overreaching element of the first directional protective relay passed after being passed through a first time delay, the output of the first AND gate and the second AND gate are inputted to an OR gate, the output of the OR gate is communicated to the circuit breaker to interrupt the electrical power flow of the respective section of the electrical power line when the output of the OR gate is high.

9. The system of claim 1, wherein the cyber health module comprises an XNOR gate that receives the remote signals from the two remote directional protective relays as input, the output of the XNOR gate is inputted to an AND gate with the operational status of the communication channel, the output of the AND gate is the reliability signal.

10. The system of claim 9, wherein the remote signal from one of the remote directional protective relays operates on the respective section of the electrical power line and the other one of the remote directional protective relays operates on an adjacent electrical power line or adjacent element to the respective section of the electrical power line.

11. The system of claim 1, wherein the communication channels comprise redundant communication channels.

12. A cyber health module in a respective substation for protection of an electrical grid, the electrical grid comprising electrical power lines between the respective substation and remote substations and communication channels connecting the respective substation to at least one other substation, the respective substation comprising a directional relay to generate a forward overreaching signal when a fault is detected on the electrical power line, the cyber health module comprising circuitry configured to:
  receive remote signals, via a receiver over the communication channel, from two remote directional protective relays from the remote substations;
  receive a status indicator for operationality of the communication channels; and
  output a reliability signal determined based on consistency of the remote signals and the status indicator of the communication channels.

13. The cyber health module of claim 12, wherein the cyber health module comprises an XNOR gate that receives the remote signals from the two remote directional protective relays as input, the output of the XNOR gate is inputted to an AND gate with the operational status of the communication channel, the output of the AND gate is the reliability signal.

14. The cyber health module of claim 13, wherein the remote signal from one of the remote directional protective relays operates on the respective section of the electrical power line and the other one of the remote directional protective relays operates on an adjacent electrical power line or adjacent element to the respective section of the electrical power line.

15. A method for protection of an electrical grid, the method implemented on a respective substation, the method comprising:
  detecting a fault on a respective section of an electrical power line connected between the respective substation and a remote substation using a forward overreaching element of a first directional protective relay;
  receiving remote signals from remote directional protective relays in remote substations connected to the electrical power line over a communication channel;
  generating a reliability signal indicating consistency of the remote signals received from the remote directional protective relays and a status of the communication channels being operational; and
  interrupting electrical power flow in the respective section of the electrical power line when the reliability signal from a cyber health module indicates consistency, the first directional protective relay indicates fault, and at least one of the remote directional protective relays indicate fault.

16. The method of claim 15, further comprising interrupting electrical power flow in the respective section of the electrical power line after a second time delay when a fault is detected on the respective section of the electrical power line by the forward overreaching element of the first directional protective relay, and the reliability signal indicates inconsistency.

17. The method of claim 16, wherein interrupting electrical power flow in the respective section of the electrical power line comprises awaiting a first time delay prior to determining when the reliability signal from the cyber health module indicates consistency, the first directional protective relay indicates fault, and at least one of the remote directional protective relays indicate fault.

18. The method of claim 15, wherein the remote signals comprise a signal from a forward overreaching element of a first remote directional protective relay on the respective section of the electrical power line and a signal from a reverse-looking element of a second remote directional protective relay on an adjacent section of the electrical power line or an adjacent element.

19. The method of claim 15, wherein the remote signals comprise a signal from a forward underreaching element of a first remote directional protective relay on the respective section of the electrical power line and a signal from a reverse-looking element of a second remote directional protective relay on an adjacent section of the electrical power line or an adjacent element.

20. The method of claim 15, wherein generating a reliability signal comprises passing the remote signals from the two remote directional protective relays to an XNOR gate, the output of the XNOR gate is inputted to an AND gate with the operational status of the communication channel, the output of the AND gate is the reliability signal.

* * * * *